United States Patent
Lin et al.

(10) Patent No.: US 11,569,445 B2
(45) Date of Patent: Jan. 31, 2023

(54) CAPPED CONTACT STRUCTURE WITH VARIABLE ADHESION LAYER THICKNESS

(71) Applicant: MACRONIX INTERNATIONAL CO., LTD., Hsinchu (TW)

(72) Inventors: Yu-Yu Lin, Taipei (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 64 days.

(21) Appl. No.: 17/162,803

(22) Filed: Jan. 29, 2021

(65) Prior Publication Data

US 2021/0151677 A1    May 20, 2021

Related U.S. Application Data

(62) Division of application No. 14/750,801, filed on Jun. 25, 2015, now abandoned.

(60) Provisional application No. 62/106,745, filed on Jan. 23, 2015.

(51) Int. Cl.
*H01L 45/00* (2006.01)

(52) U.S. Cl.
CPC ............ *H01L 45/146* (2013.01); *H01L 45/04* (2013.01); *H01L 45/1233* (2013.01); *H01L 45/1253* (2013.01); *H01L 45/16* (2013.01); *H01L 45/1633* (2013.01)

(58) Field of Classification Search
CPC .............. H01L 45/146; H01L 45/1233; H01L 45/1253; H01L 45/1633
See application file for complete search history.

(56) References Cited

U.S. PATENT DOCUMENTS

| | | | |
|---|---|---|---|
| 4,729,815 | A | 3/1988 | Leung |
| 5,077,691 | A | 12/1991 | Haddad et al. |
| 5,126,973 | A | 6/1992 | Gallia et al. |
| 5,325,334 | A | 6/1994 | Roh et al. |
| 5,537,665 | A | 7/1996 | Patel et al. |
| 5,590,085 | A | 12/1996 | Yuh et al. |
| 5,621,691 | A | 4/1997 | Park |
| 5,732,030 | A | 3/1998 | Dorney |

(Continued)

FOREIGN PATENT DOCUMENTS

| | | |
|---|---|---|
| CN | 101335330 A | 12/2008 |
| CN | 101652842 A | 2/2010 |

(Continued)

OTHER PUBLICATIONS

Baik, I.G., "Highly Scalable Non-volatile Resistive Memory using Simple Binary Oxide Driven by Asymmetric Unipolar Voltage Pulses," IEEE IEDM Dec. 13-15, 2004, 4 pages.

*Primary Examiner* — Shih Tsun A Chou
(74) *Attorney, Agent, or Firm* — Andrew L. Dunlap; Haynes Beffel & Wolfeld LLP (57) ABSTRACT

Metal oxide based memory devices and methods for manufacturing are described herein. A method for manufacturing a memory cell includes forming a bottom adhesion layer in a via formed in an insulating layer. Forming a bottom conductive plug in the bottom adhesion layer. Forming a top adhesion layer over the bottom adhesion layer and bottom conductive plug. Forming a top conductive plug in the top adhesion layer. Wherein the thickness of the bottom and top adhesion layers may be different from one another.

9 Claims, 10 Drawing Sheets

(56) References Cited

U.S. PATENT DOCUMENTS

| | | |
|---|---|---|
| 5,812,466 A | 9/1998 | Lee et al. |
| 5,953,270 A | 9/1999 | Kim |
| 5,959,904 A | 9/1999 | Oh |
| 5,999,463 A | 12/1999 | Park et al. |
| 6,002,620 A | 12/1999 | Tran et al. |
| 6,037,268 A | 3/2000 | Dautartas et al. |
| 6,094,384 A | 7/2000 | Ka |
| 6,115,300 A | 9/2000 | Massoumi et al. |
| 6,141,268 A | 10/2000 | Chen et al. |
| 6,205,515 B1 | 3/2001 | Huang |
| 6,317,355 B1 | 11/2001 | Kang |
| 6,337,816 B1 | 1/2002 | Park et al. |
| 6,342,446 B1 | 1/2002 | Smith et al. |
| 6,343,037 B1 | 1/2002 | Park et al. |
| 6,445,626 B1 | 9/2002 | Hsu et al. |
| 6,490,208 B2 | 12/2002 | Yoon |
| 6,496,425 B1 | 12/2002 | Abedifard et al. |
| 6,603,690 B1 | 8/2003 | Chen et al. |
| 6,665,221 B2 | 12/2003 | Abedifard et al. |
| 6,671,214 B2 | 12/2003 | Abedifard et al. |
| 6,674,676 B1 | 1/2004 | Hsu et al. |
| 6,678,191 B2 | 1/2004 | Lee et al. |
| 6,915,467 B2 | 7/2005 | Pilo |
| 6,966,012 B1 | 11/2005 | Gandhi |
| 7,064,990 B1 | 6/2006 | Dawson et al. |
| 7,134,057 B1 | 11/2006 | Kaushik et al. |
| 7,251,173 B2 | 7/2007 | Lunde et al. |
| 7,252,852 B1 | 8/2007 | Parkin |
| 7,570,536 B2 | 8/2009 | Chi |
| 7,738,308 B2 | 6/2010 | Afghahi et al. |
| 7,742,338 B2 | 6/2010 | Santin et al. |
| 7,760,553 B2 | 7/2010 | Jang |
| 7,800,094 B2 | 9/2010 | Ho et al. |
| 7,943,920 B2 | 5/2011 | Chien et al. |
| 8,279,656 B2 | 10/2012 | Chien et al. |
| 8,372,761 B2 | 2/2013 | Kabe et al. |
| 8,488,387 B2 | 7/2013 | Lue et al. |
| 8,699,258 B2 | 4/2014 | Chien et al. |
| 8,824,212 B2 | 9/2014 | Lue |
| 8,921,200 B2 | 12/2014 | Kawashima et al. |
| 8,969,844 B1 | 3/2015 | Wang |
| 9,165,680 B2 | 10/2015 | Hung et al. |
| 9,680,095 B2 | 6/2017 | Chen et al. |
| 10,141,507 B2 | 11/2018 | Lin et al. |
| 2004/0113232 A1 | 6/2004 | Johnson et al. |
| 2004/0123181 A1 | 6/2004 | Moon et al. |
| 2004/0228172 A1 | 11/2004 | Rinerson et al. |
| 2005/0247921 A1 | 11/2005 | Lee et al. |
| 2006/0043355 A1 | 3/2006 | Ryoo et al. |
| 2006/0166476 A1 | 7/2006 | Lee et al. |
| 2007/0241319 A1* | 10/2007 | Chang .................... H01L 45/16 257/3 |
| 2008/0304312 A1 | 12/2008 | Ho et al. |
| 2008/0308781 A1 | 12/2008 | Liao et al. |
| 2009/0154222 A1 | 6/2009 | Chien et al. |
| 2009/0180340 A1 | 7/2009 | Song et al. |
| 2009/0269918 A1 | 10/2009 | Ma et al. |
| 2010/0107004 A1 | 4/2010 | Bottelli et al. |
| 2010/0258778 A1 | 10/2010 | Sung |
| 2010/0308298 A1 | 12/2010 | Ninomiya et al. |
| 2011/0002155 A1 | 1/2011 | Arita et al. |
| 2011/0140069 A1 | 6/2011 | Inoue |
| 2012/0032133 A1 | 2/2012 | Miller et al. |
| 2012/0075943 A1 | 3/2012 | Chen et al. |
| 2012/0104350 A1 | 5/2012 | Himeno et al. |
| 2012/0280199 A1 | 11/2012 | Takagi |
| 2012/0292588 A1 | 11/2012 | Fujii et al. |
| 2012/0319071 A1 | 12/2012 | Awaya et al. |
| 2013/0082230 A1 | 4/2013 | Katayama et al. |
| 2013/0178042 A1 | 7/2013 | Ninomiya et al. |
| 2013/0228735 A1 | 9/2013 | Higuchi et al. |
| 2014/0264232 A1 | 9/2014 | Lee et al. |
| 2016/0218286 A1 | 7/2016 | Lin et al. |

FOREIGN PATENT DOCUMENTS

| | | |
|---|---|---|
| CN | 102610263 A | 7/2012 |
| CN | 104051618 A | 9/2014 |

* cited by examiner

CAPPED CONTACT STRUCTURE WITH VARIABLE ADHESION LAYER THICKNESS

REFERENCE TO RELATED APPLICATIONS

Related Application

This application is a divisional of U.S. patent application Ser. No. 14/750,801 filed on 25 Jun. 2015 (now abandoned), which application claims the benefit of U.S. Provisional Patent Application No. 62/106,745 filed on 23 Jan. 2015, which applications are incorporated by reference as if fully set forth herein.

BACKGROUND OF THE INVENTION

Field of the Invention

The present invention relates to metal oxide based memory devices and methods for manufacturing such devices.

Description of Related Art

Resistive random access memory, RRAM, is a type of nonvolatile memory that provides the benefits of small cell size, scalability, ultrafast operation, low-power operation, high endurance, good retention, large On/Off ratio, and CMOS compatibility. One type of RRAM includes metal oxide layers than can be caused to change resistance between two or more stable resistance ranges by application of electrical pulses at levels suitable for implementation in integrated circuits and the resistance can be read and written with random access to indicate stored data.

RRAM memory may include a metal oxide memory element in a current path between first and second electrodes. The electrodes may be terminals to access devices and/or may be coupled to access lines such as bit, word, and source lines. The access lines are connected to circuitry to perform operations, such as SET and RESET operations, which may operate to change the state of the memory element in order to store data.

Figure 1A:
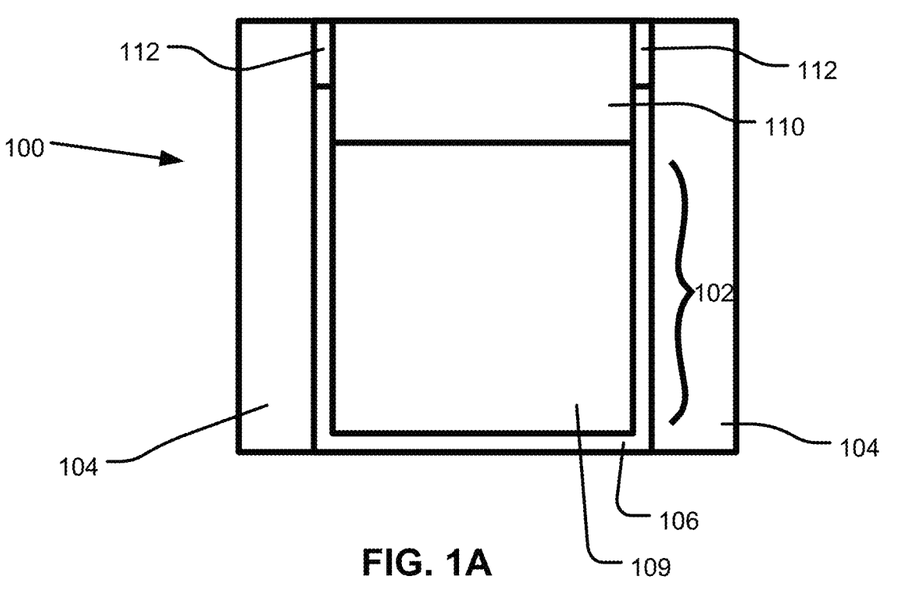
FIG. 1A is a schematic of a memory cell with a single adhesion layer.

In prior methods of forming a RRAM memory cell, the top surface of an interlayer conductor 102, comprising an adhesion layer 106 liner and a conductive plug 109, located in a via in an insulation layer 104, is oxidized. The resulting structure of this oxidation process is shown schematically in FIG. 1A, along with corresponding TEM image in FIG. 1B. When the top surface of the interlayer conductor 102 is oxidized, both the top portions of the conductive plug and the liner are oxidized, resulting in regions of oxidized plug 110 and regions of oxidized adhesion layer 112. After the oxidation process, a top electrode 114 is formed over at least the metal oxide memory material to form a memory cell.

Due to the thickness and/or the material of the adhesion layer 106, it is sometimes difficult for the both the conductive plug 109 and adhesion layer 106 to be fully oxidized. For example it is difficult to fully oxidize a thick TiN adhesion layer within a tungsten plug. The partial and non-uniformly oxidation of the adhesion layer within a cell and from cell to cell causes non-uniform operation of the device. This results in yield loss of large array devices.

Previous technology to prevent the uncertainty of the adhesion layer oxidation includes using an etching back process to remove a portion of the adhesion layer material, for example TiN, at top surface of the interlayer conductor. FIG. 1C shows a TEM image of a device that an etching back process was performed on. Due to the lack of presence of the adhesion layer in the oxidized portion of the interlayer conductor the uncertainty of adhesion layer of oxidation is removed. However, the etching back process may create a sharp and rough edge of the conductive plug 109, as shown in the TEM image of FIG. 1D, which causes larger operation condition variation. Further, for devices using a plasma oxidation method, as shown in the TEM image of FIG. 1E, the oxidized tungsten and TiN film at the surface is thin and the TiN/W surface area is important factor to the tail distribution.

Also, in prior methods of forming a RRAM memory cell the aspect ratio, depth divided by diameter, of the via which a single conductive plug is formed in may be high, for example over 1.5. High aspect ratios lead to voids forming in the conductive plug during deposition. Voids in the conductive plugs are also referred to as seams. The formation size and shape of the voids is inconsistent from plug to plug in a device. During a CMP process the voids may be present at the top oxidized portion of the conductive plug forming the memory element. This is undesirable because the oxide film of the memory element can not be flat and will have poor coverage. A void in the conductive plug 109 and portions of the oxidized plug 110 are visible in FIG. 1C, note the lighter coloring in the center of the TEM image. The presence and inconsistencies of voids in the conductive plug and memory elements leads to inconsistent electrical properties of memory cells in a device. The problems associated with voids in the conductive plugs are referred to as "the seam issue".

It is therefore desirable to provide a memory cell and method of manufacture that includes a small ratio of oxide of the adhesion layer material to the conductive plug material without the disadvantages of the etch back process.

SUMMARY OF THE INVENTION

Memory devices based on metal oxide memory layers, for example tungsten-oxide, are described along with methods for manufacturing.

An example of a memory device comprises top and bottom electrodes with a memory element located between and electrically coupled to the top and bottom electrodes. In an example embodiment, the memory device comprises a bottom electrode in the form of a multi component interlayer conductor, a memory layer on the interlayer conductor including a metal oxide, and a top electrode over the metal oxide. The multi component interlayer conductor includes a top and bottom portion. The top and bottom portion each include a conductive plug inside of an adhesion layer lining the via and including sidewall portions and bottom portions. The top adhesion layer of the upper portion may have a different sidewall thickness than the bottom adhesion layer of the lower portion. The conductive plugs are comprised of transition metal. The memory layer can include a layer of metal oxide.

An example of a method of fabricating a memory device is carried out as follows. A bottom adhesion layer is formed in a via formed in an insulating layer, lining the bottom portion of the via. For example, this bottom adhesion layer may be TiN. A bottom conductive plug, such as a tungsten plug, is deposited using CVD in the bottom adhesion layer. The bottom conductive plug and bottom adhesion layer are then recessed below the top surface of the insulation layer. Alternatively, an additional insulation layer may be deposited with a new via created to be aligned over the bottom conductive plug and bottom adhesion layer, resulting in a similar configuration as the previously stated recessing process. A top adhesion layer, is formed in upper portion of the via lining the upper portion of the via. In the example the top adhesion layer is also composed of TiN. Because the via the top adhesion layer is formed in is aligned over the bottom adhesion layer and bottom conductive plug, the top adhesion layer is deposited over the bottom conductive plug and bottom adhesion layer. A top conductive plug, for example a tungsten plug, is deposited using CVD in the top adhesion layer. The thickness of the bottom and top adhesion layers may be different from one another.

In an example, the top adhesion layer may be thinner than the bottom adhesion layer. This difference of thickness has the advantage of a lower surface area ratio of the adhesion layer to the conductive plug which has the advantage of a more uniform device because of less uncertainty caused by oxidation of the adhesion layer. Further, the two conductive plugs of the interlayer conductor each have lower aspect ratios than a single conductive plug in the same via, therefore the likelihood of a void forming when depositing each conductive plug is significantly reduced compared to forming a single conductive plug in the via. Therefore, because the interlayer conductors produced with this method do not includes "seam", voids, this technology is referred to as "seam free" and is a solution to "the seam issue" discussed above.

The steps of forming the upper and lower portions of the interlayer conductor are followed by forming a memory layer on the electrode surface of the interlayer conductor, specifically the top conductive plug. For example, a rapid thermal oxidation may be used to create a metal oxide layer from the metal of the top conductive plug. In the example, the metal of the conductive plug is tungsten, therefore the metal oxide is tungsten oxide (WOx). During the oxidation process, the material in the adhesion layer is also oxidized. This material may be harder to ensure complete oxidation, and it is therefore beneficial for the top surface of the interlayer conductor to have a low ratio of area of the adhesion layer to area of top conductive plug. Therefore in embodiments, it is beneficial for the top adhesion layer to have thinner sidewall portions than the bottom adhesion layer so that the ratio of adhesion layer surface to the top conductive plug surface at the top of the interlayer conductor is low.

After formation of the memory layer, a top electrode material is deposited on the memory layer. The method of fabricating a memory device may further include forming circuitry for performing read operations, and write operations (such as SET and RESET operations).

The structure and methods of the present invention are disclosed in the detailed description below. Other aspects and advantages of the present invention can be seen on review of the drawings, the detailed description and the claims, which follow.

BRIEF DESCRIPTION OF THE DRAWINGS

The invention will be described with respect to the specific embodiments thereof, and reference will be made to the drawings, in which.

DETAILED DESCRIPTION

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

Figure 2A:
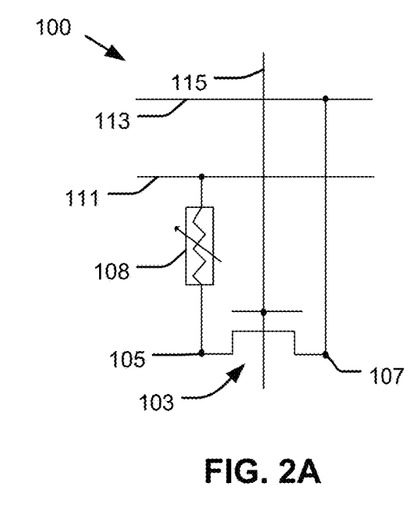
FIG. 2A is a schematic of a memory cell in accordance with an embodiment.

FIG. 2A illustrates a schematic of a memory cell 100 in accordance with an embodiment. The memory cell 100 includes an access device in the form of a transistor 103 with a first terminal 105 and a second terminal 107. The memory cell further includes a memory element 108 located between the first terminal 105 and a first access line 111, in the example a bit line, and a second access line 113, in the example a source line, connected to the second terminal 107. In the embodiment shown with the access device being transistor 103, the memory device further includes a third access line 115, in the example a word line, connected to the gate of the transistor 103. Alternatively, in embodiments, the access device may be a diode, such as is shown in the cross-point array of memory cells 100 in FIG. 1B and, in such embodiments, a third access line is not included. It will be understood that the memory array is not limited to the array configuration illustrated in FIG. 2B and additional array configurations can also be used with memory cells including a top electrode layer as disclosed above. Additionally, instead of MOS transistors, bipolar transistors or diodes may be used as access devices in some embodiments.

Figure 3:
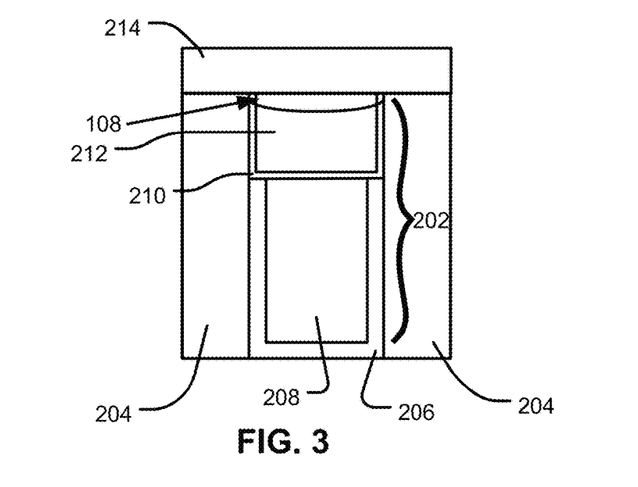
FIG. 3 is a simplified cross-sectional view of a first example of a variable resistance memory element.

FIG. 3 is a simplified cross-sectional view of a first example of a variable resistance memory element 108. A multi component interlayer conductor 202 extends through a dielectric insulator layer 204, for example a silicon dioxide layer. The interlayer conductor 202 on one end may be coupled to an access device, such as a drain terminal of an access transistor or a terminal of a diode; or an access line. In the embodiment shown, the interlayer conductor 202 comprises a bottom adhesion layer 206, a bottom conductive plug 208, a top adhesion layer 210 and a top conductive plug 212. In the embodiment shown, the conductive plugs are tungsten plugs and the adhesion layers are TiN liners including sidewall portions and bottom portions. In embodiments, the top and bottom conductive plugs may be the same or different materials. In embodiments the adhesion layers may be the same or different materials and each may be comprised of one or more layers. Advantages of the adhesion layers having the same material composition include simplifying the manufacturing process. Advantages of the adhesion layers having different material compositions include the material of each being suited for processes that immediately follow the formation of the layer. In embodiments, the adhesion layers are formed of multiple layers which includes the advantage of better coverage of the structure. In embodiments, the material of the conductive plugs could be other metals such as Ti, Ta, Al, TiN, TaN, Cu and Hf. In embodiments, the memory element is formed by oxidizing the top conductive plug, therefore in these embodiments the material for the top conductive plug is a ReRam material. The adhesion layer can be a conductive metal nitride including titanium nitride, tungsten nitride, tantalum nitride, titanium, and others. Adhesion layers can also be a metal such as titanium.

The memory element 108 is located on the top electrode surface of the upper portion interlayer conductor including the top surfaces of the top adhesion layer 210 and the top conductive plug 212. In embodiments, the top electrode surface may be flattened and smoothed during a roughness tuning process, including an ion bombardment step. The memory element 108 may be comprised of one or more tungsten-oxygen compounds (WOx), for example one or more of $WO_3$, $W_2O_5$, $WO_2$. On top of the memory element 108 is a top electrode 214, in this embodiment an access line.

The memory cell shown in FIG. 3 comprising a multi-component interlayer conductor can be formed by the manufacturing steps illustrated in FIGS. 4A-4G. The illustrations of the processes highlight the memory element component of the memory cell and omit an access device and components of the memory cell that are specific to particular access devices and access line and array configurations.

Figure 4A:
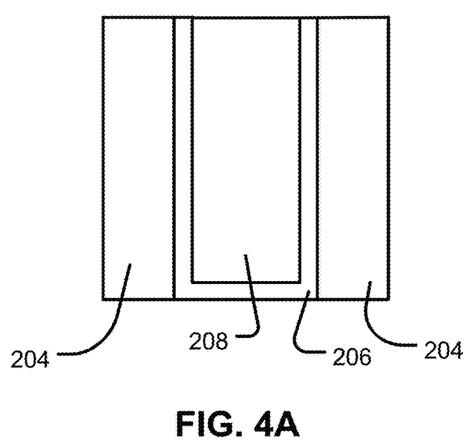
FIGS. 4A, 4B, 4C, 4D, 4E, 4F, and 4G are schematic illustrations of the steps of manufacture of a memory cell in accordance with an embodiment.
Figure 5A:
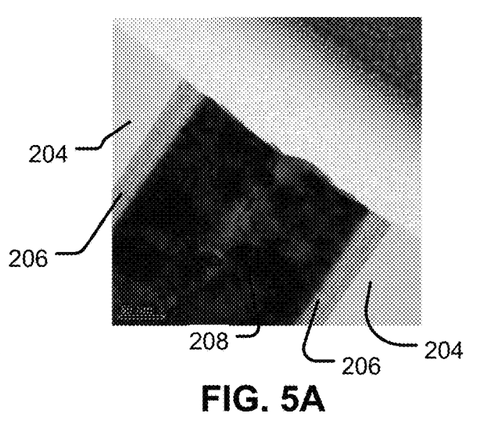
FIG. 5A is a TEM image corresponding to FIG. 4A.

As shown in FIG. 4A, a bottom adhesion layer 206 and bottom conductive plug 208 are formed through a via formed in the dielectric insulator layer 204 similar to processes of manufacturing a memory cell with a single adhesion layer and conductive plug. In the embodiment shown, the adhesion layer is a TiN liner. The TiN liner may be formed within the vias by chemical vapor deposition (CVD). Further, in the embodiment shown, the bottom conductive plug 208 is a tungsten plug. The tungsten plug may be formed within the TiN liner in the via by chemical vapor deposition (CVD) of tungsten material. FIG. 5A is a TEM image corresponding to FIG. 4A.

Figure 4B:
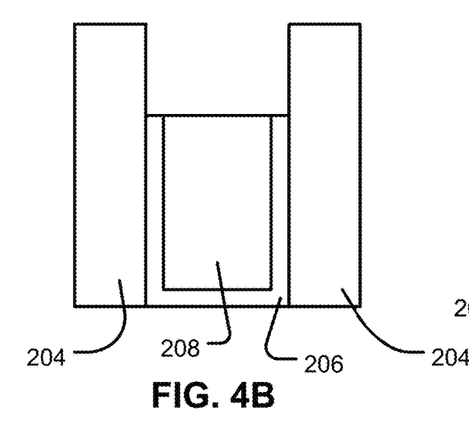
Figure 5B:
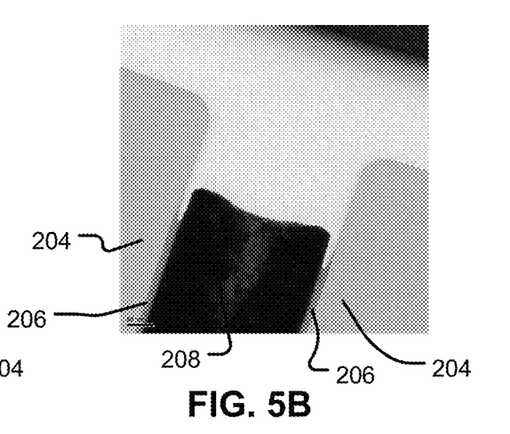
FIG. 5B is a TEM image corresponding to FIG. 4B.

Next, a recessing process is performed, for example a CMP process, resulting in the structure shown in FIG. 4B. As shown, the resulting structure includes the top surface of the bottom conductive plug 208 being recessed below the top surface of the dielectric insulator layer 204. The bottom adhesion layer 206 may be recessed the same depth or deeper than the bottom conductive plug 208. In FIG. 4B the bottom adhesion layer 206 is shown as being recessed a similar depth as the bottom conductive plug 208. In embodiments, this recess may be about 2000 A deep. FIG. 5B, which is a TEM image corresponding to FIG. 4B. In the embodiment shown in FIG. 5B the bottom adhesion layer 206 is recessed a deeper depth than the bottom conductive plug 208, this deeper recessing may be caused by a CMP process causing greater recessing of softer materials than harder materials.

Alternatively, instead of recessing the bottom adhesion layer 206 and bottom conductive plug 208 below the top surface of the dielectric insulator layer 204, a second layer 216 of dielectric material may be deposited on top of the initial dielectric material and vias formed to be aligned with the already formed bottom adhesion layer 206 and bottom conductive plug 208, resulting in the structure shown in FIG. 4C.

Figure 4C:
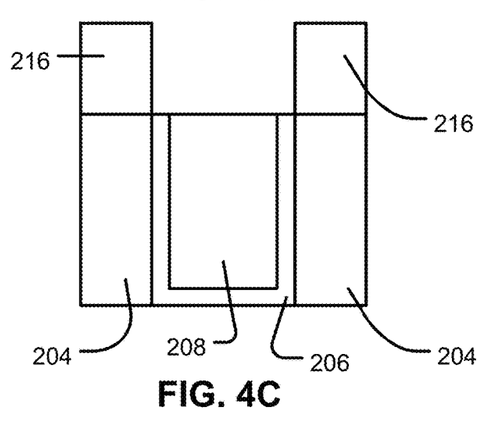
Figure 4D:
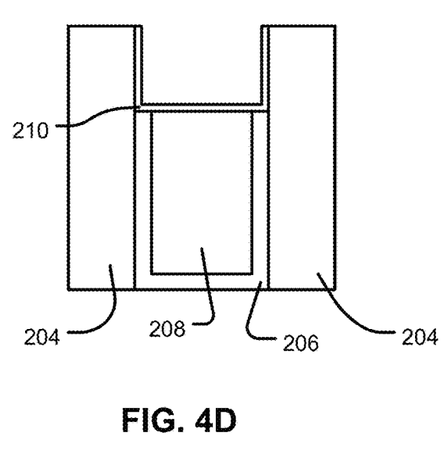
Figure 4E:
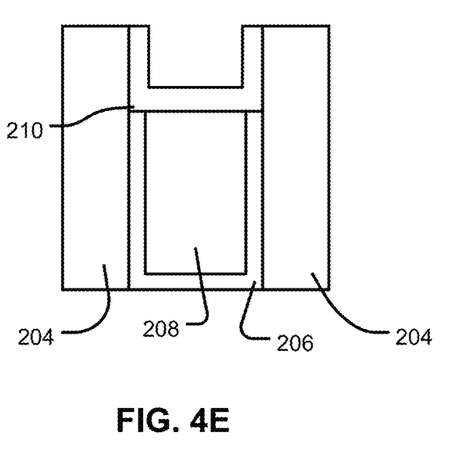

With either the method shown in FIG. 4B or FIG. 4C, the resulting structure is a recessed bottom adhesion layer 206 and bottom conductive plug 208. After a process of forming the recessed lower portion of the interlayer conductor a top adhesion layer 210 is formed in the recess over the bottom adhesion layer 206 and bottom conductive plug 208, resulting in the structures shown in FIGS. 4D and 4E. FIG. 4D shows an embodiment wherein the top adhesion layer 210 is formed with sidewall and bottom portions that are thinner than the sidewall and bottom portions of the bottom adhesion layer 206. FIG. 4E shows an embodiment wherein the top adhesion layer 210 is formed with sidewall and bottom portions that are thicker than the sidewall and bottom portions of the bottom adhesion layer 206. Advantages of a thicker top adhesion layer include embodiments wherein the material of the top conductive plug 212 is a functional material and material of the top adhesion layer 210 is not a functional material. In this example, the thicker top adhesion layer 210 reduces the reactive area of the top of the bottom conductive plug 208 during processes such as oxidizing. This reduced reactive area is advantageous because operation current is roughly proportional to the area size. Therefore, the reduced area has a reduced operation current which is beneficial to scaling and power consumption. The top adhesion layer 210 may be formed by depositing the adhesion layer material on the dielectric insulator layer 204 wherein the material coats the inside of the recess including the walls of the via and top surface of the bottom portion of the interlayer conductor including the bottom adhesion layer 206 and bottom conductive plug 208, the deposited material is then patterned and etched to form the top adhesion layer 210 lining in the recess.

Figure 4F:
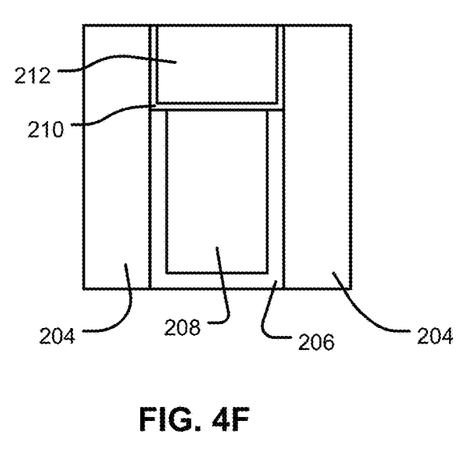
Figure 4G:
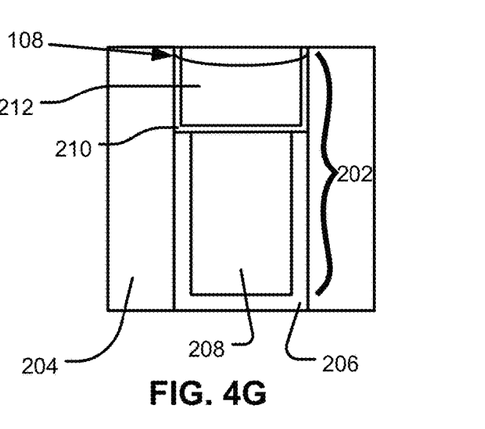
Figure 5C:
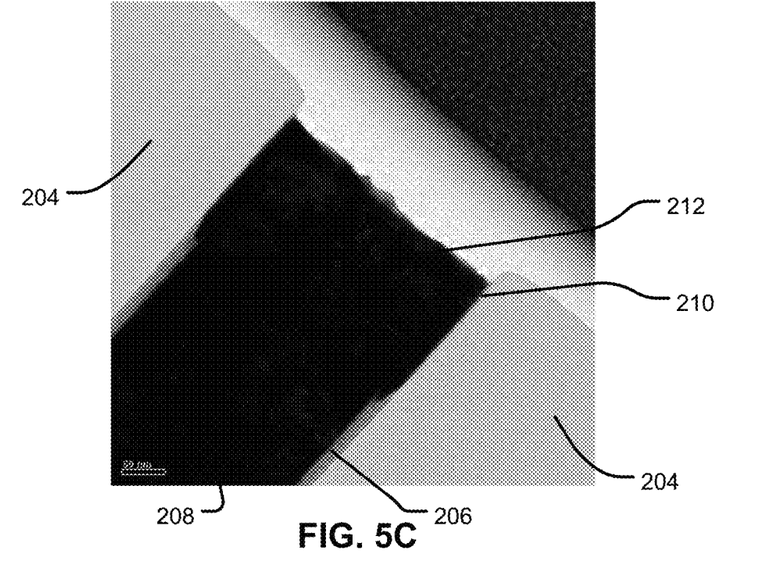
FIG. 5C is a TEM image corresponding to FIG. 4F.
Figure 5D:
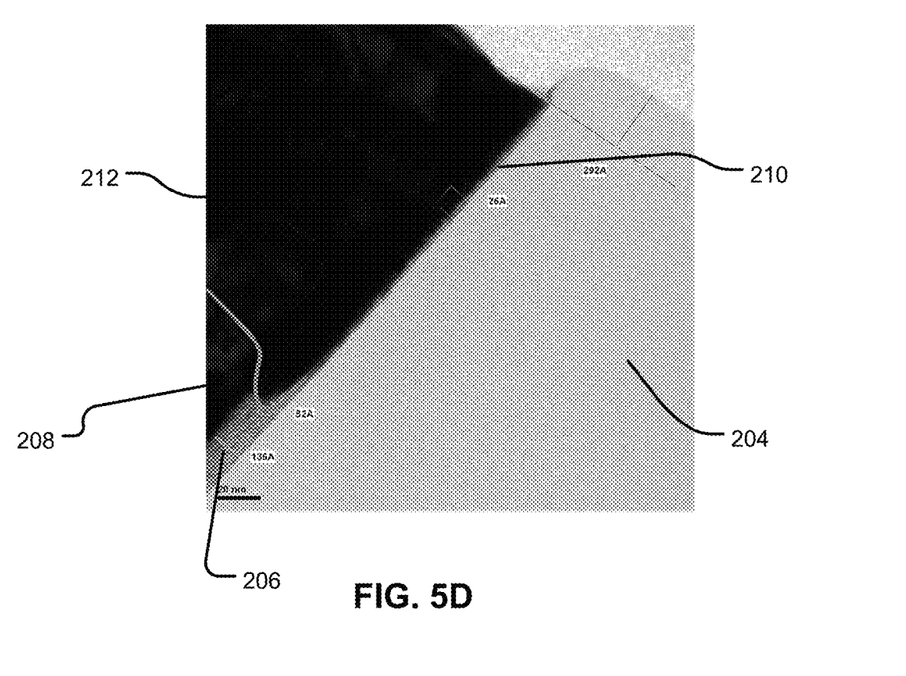
FIG. 5D is a close up TEM image of FIG. 5C.

Next, a top conductive plug 212 is formed in the top adhesion layer 210 resulting in the structure shown in FIG. 4F, corresponding to the embodiment shown in FIG. 4D. The top conductive plug 212 may be formed within the top adhesion layer 210 by chemical vapor deposition (CVP) of a metal, for example tungsten. This deposition process may result in a rough top surface of the interlayer conductor 202 due to grain growth in the CVP process, as show in in the TEM image in FIG. 5C and close up annotated TEM image shown in FIG. 5D, both corresponding to FIG. 4F. This roughness may be flattened through a smoothing ion bombardment process to produce a better device.

Next a metal oxide layer may be formed to create the memory element 108. In the embodiment shown, an oxidation step is performed wherein the top portions of the top conductive plug 212 and top adhesion layer 210 are oxidized to form a metal oxide memory element 108, resulting in the structure shown in FIG. 4G. For example, a thermal oxidation process may be performed wherein the top portion of the interlayer conductor 202 is exposed to 10 slm (standard liters per minute) of Oxygen gas at 500° C. for 1 minute. In embodiments, the metal oxide layer may be formed through other types of oxidation process, for example Photo-oxidation WOx, Plasma-oxidation WOx sputtering, and reactive sputtering. Forming the metal oxide memory element 108 on the interlayer conductor 202 in this way has the advantage of creating a self-aligned layer of metal oxide on the interlayer conductor.

After the memory element 108 is formed, a top electrode 214 may be formed on top of the memory element 108, resulting in the structure shown in FIG. 3. The top electrode may be an access line or may be a conductor electrically connecting the memory element 108 to an access line or access device. In embodiments, the top electrode may be formed by depositing a layer of conductive material on top of the insulating dielectric insulator layer 204 and the memory element 108 and patterning the deposited layer to form an access line.

Figure 6:
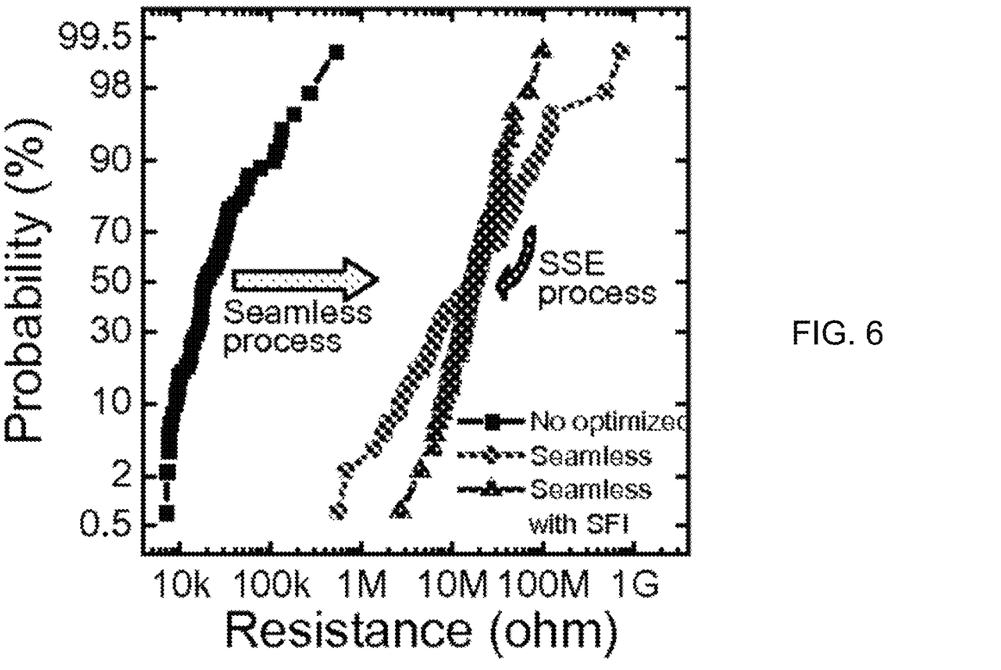
FIG. 6 is a graph showing comparison of initial resistance distributions of memory devices with different methods of manufacture.
Figure 7:
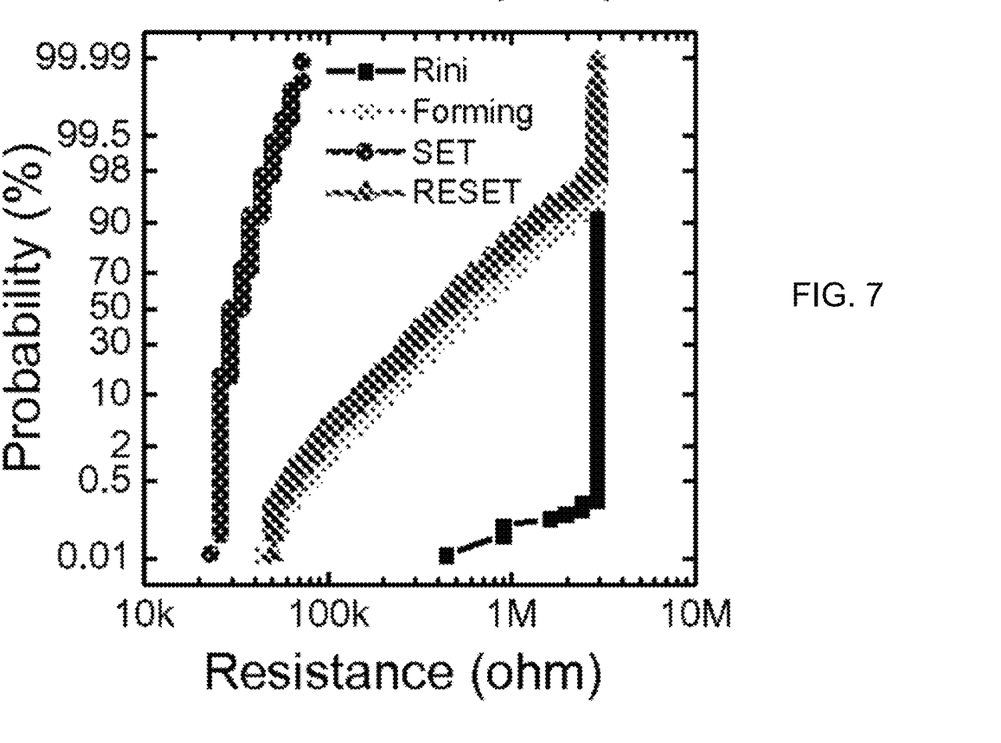
FIG. 7 is a graph showing electrical characteristics of a 1 Mb WOx RRAM ADM.
Figure 8:
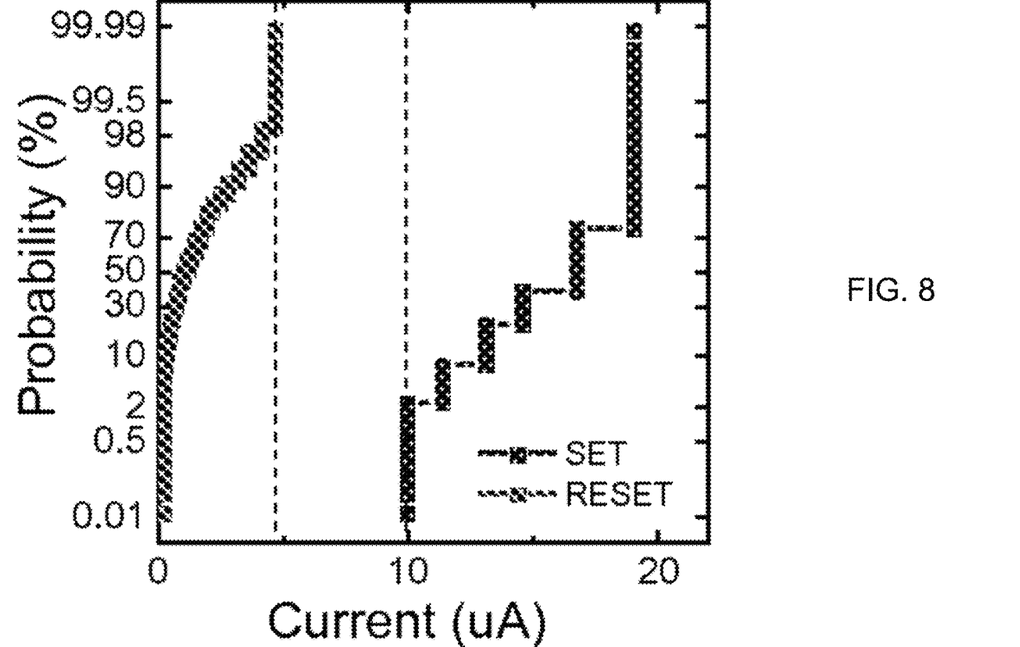
FIG. 8 is a graph showing the read window for 1 Mb ADM obtained by an optimized verify algorithm.
Figure 9:
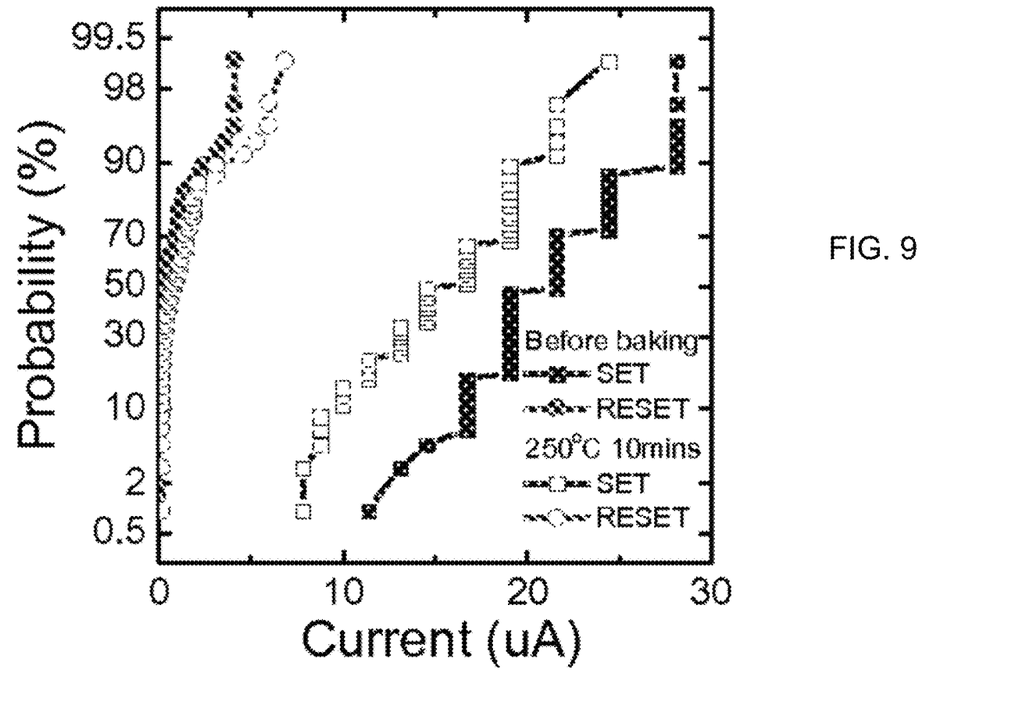
FIG. 9 is a graph showing retention of the 1 Mb WOx RRAM ADM at 250° C. for 10 mins.
Figure 10:
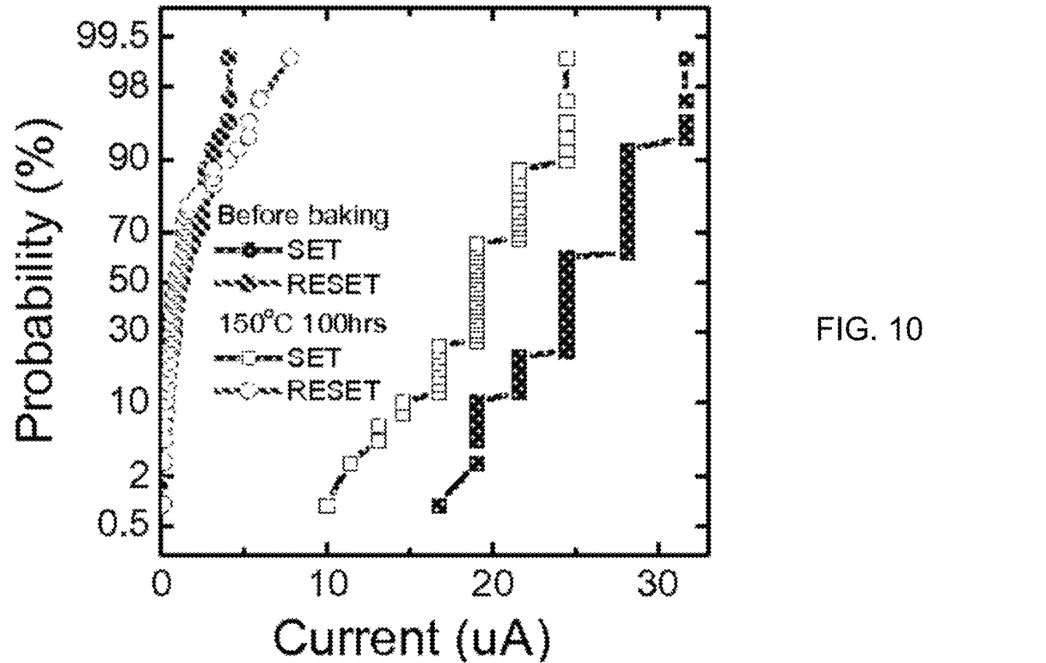
FIG. 10 is a graph showing retention of the 1 Mb WOx RRAM ADM at 150° C. for 100 hrs.
Figure 11:
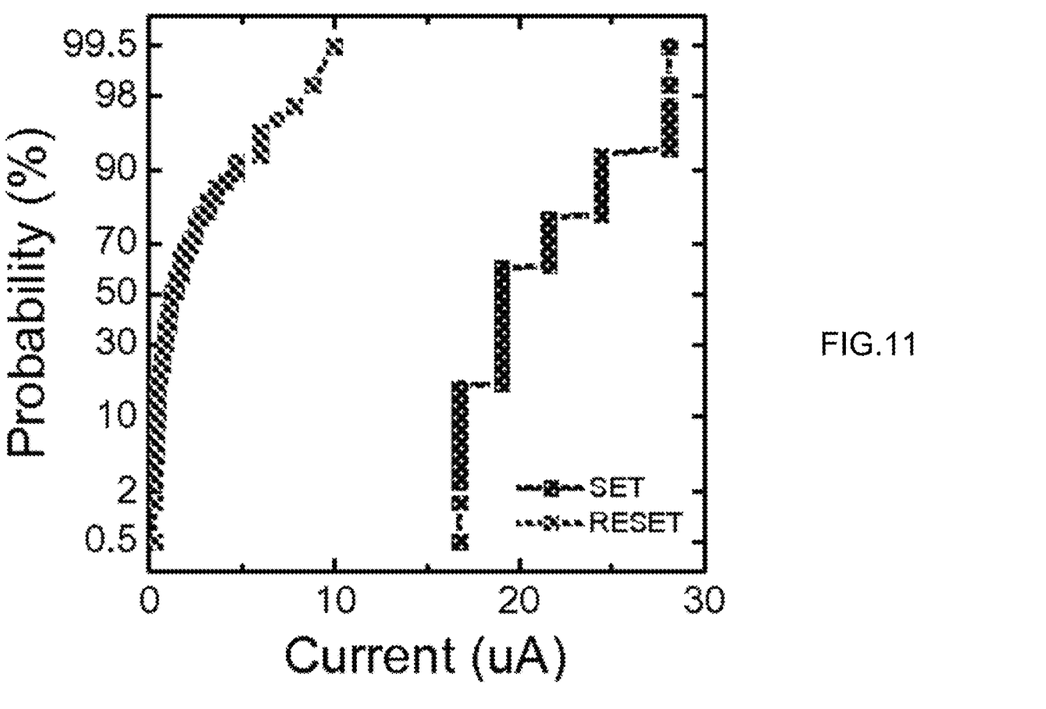
FIG. 11 is a graph showing a cumulative probability plot of cell read current after 100 cycles.

Forming a memory cell with the above disclosed structure and manufacturing process including a multicomponent interlayer conductor including top and bottom adhesion layers and conductive plugs results in resistive oxide memory cells with higher initial resistances than cells manufactured without this process, as shown in FIG. 6. Specifically, FIG. 6 shows a comparison of initial resistance distributions of RRAM with different methods of manufacture. In RRAM memory devices including a multicomponent interlayer conductor as discussed above, also referred to as "seam-free engineering", the initial resistance can be elevated from a few tens of KOhm to several hundreds of KOhm compared to RREM memory device with the "seam-free" engineering. RRAM memory devices including "seam-free engineering" and surface smoothing engineering (SSE), have a tighter initial resistance distribution. Benefits of the multicomponent interlayer conductor along with a process to flatten the bottom electrode surface of the interlayer conductor, "surface smoothing engineering (SSE)", include a more uniform enhanced electrical field and more uniform resistance distribution between cells in an array, as shown in FIG. 7. For example, in a 1 Mb WOx RRAM array diagnostic module, with memory cells manufactured with the roughness tuning (also referred to as surface smoothing engineering "SSE") and the multicomponent interlayer conductor (also referred to as seamless tungsten plug technology), all the devices can be successfully formed and switched with corresponding SET and RESET operation conditions at 2.5/500 ns and −2.5 v/500 ns, respectively. Further, the median SET and RESET resistance ratio may be over 12. Further, a SET/RESET operation algorithm with verify scheme is developed and a large read window may be obtained, as shown in FIG. 8. In FIG. 8, 5 uA read current window of Set/Reset state for 1 Mb WOx RRAM is obtained by an optimized operating algorithm. Data retention performance at 250° C. for 10 minutes and 150° C. for 100 hours are shown in FIGS. 9 and 10, respectively. There is no noticeable device degradation and the read window is well maintained after high temp baking. The 250° C. tolerance is especially beneficial since this allows pre-programmed coding before PCB solder bonding that is widely practiced. FIG. 9 shows the retention of 1 Mb WOx RRAM. Read window still exists even after 250° C. baking for 10 mins. Clearly WOx can pass solder bonding process for pre-programmed chips. FIG. 10 shows the retention of 1 Mb WOx RRAM at 150° C. for 100 hrs. FIG. 11 is of cell read current after 100 cycles. FIG. 11 shows a cumulative probability plot for a cycling endurance test which show that the WOx RRAM ADM can 100% pass at least 100 cycles.

Figure 1B:
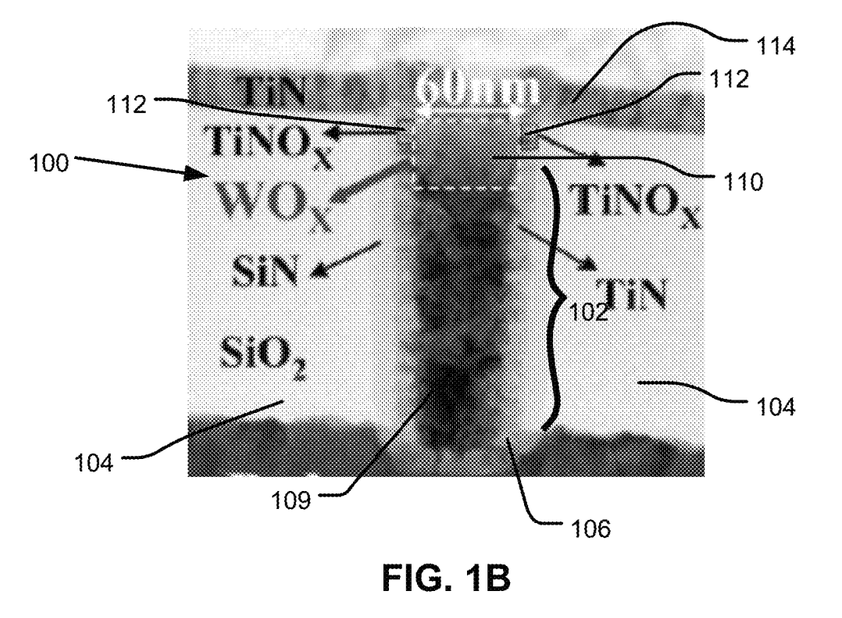
FIG. 1B is a TEM image corresponding to FIG. 1A.
Figure 1C:
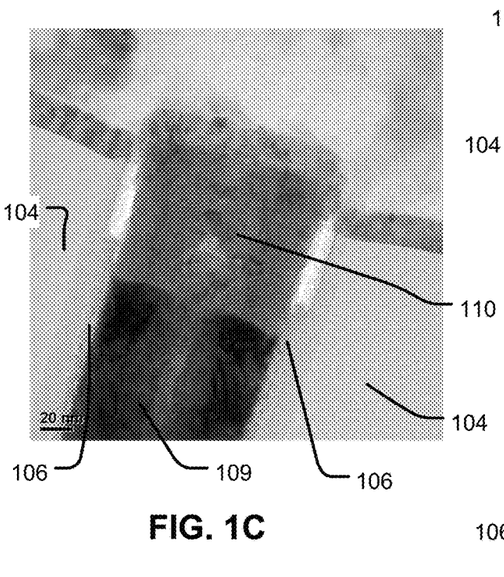
FIG. 1C is a TEM image of a memory cell with an etching back process performed to it.
Figure 1D:
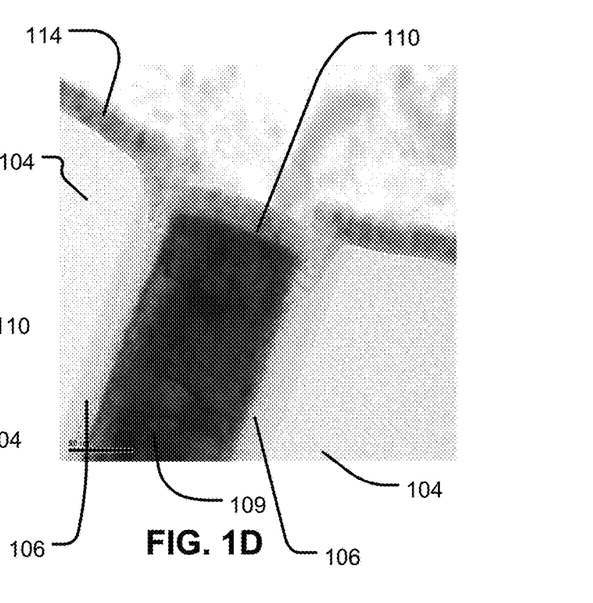
FIG. 1D is a TEM image of a memory cell with an etching back process performed to it.
Figure 1E:
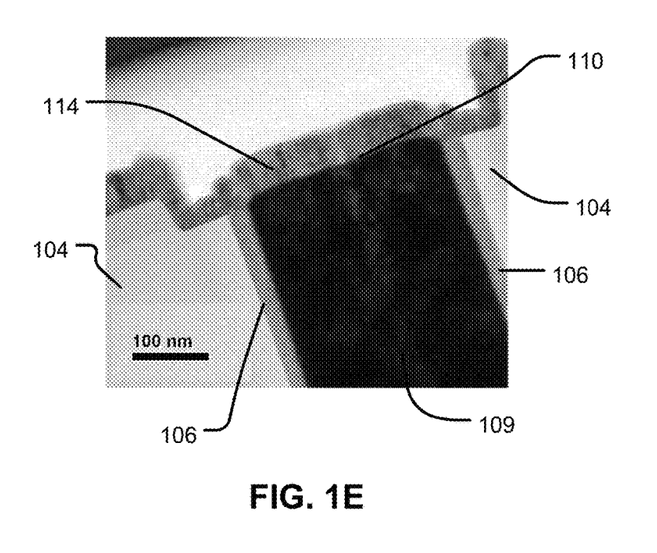
FIG. 1E is a TEM image of a memory cell with a plasma oxidation performed to it.
Figure 12:
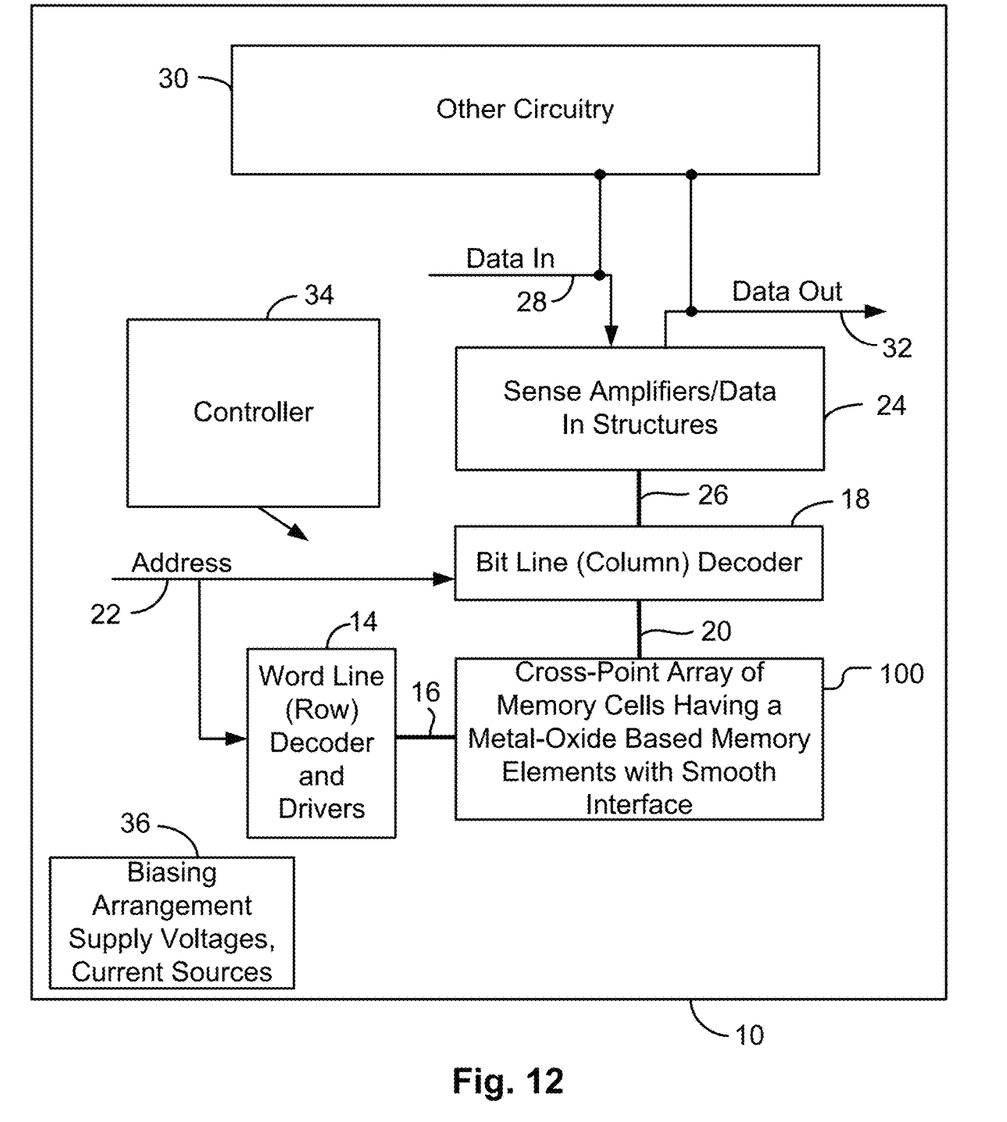
FIG. 12 is a simplified block diagram of an integrated circuit array in accordance with an embodiment.

FIG. 12 is a simplified block diagram of an integrated circuit 10 including a cross-point memory array of memory cells, such as is shown in FIG. 1B, having a metal-oxide based memory. A word line decoder 14 is coupled to and in electrical communication with a plurality of word lines 16. A bit line (column) decoder 18 is in electrical communication with a plurality of bit lines 20 to read data from, and write data to, the memory cells (not shown) in a array. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 100. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

Figure 2B:
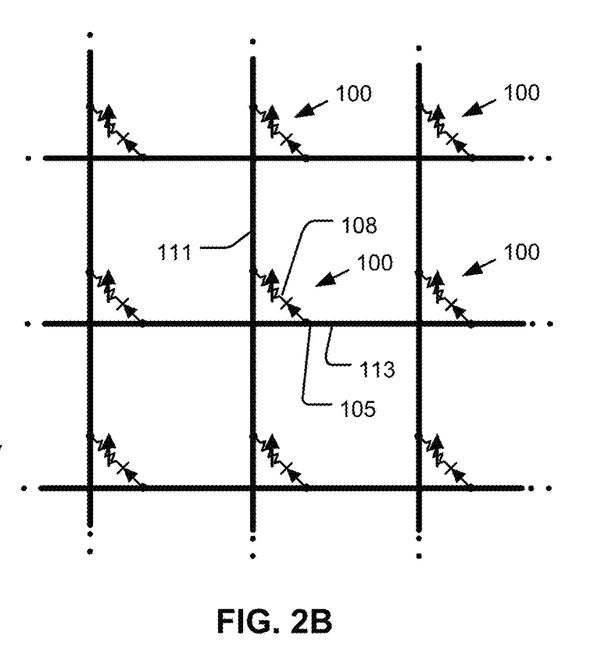
FIG. 2B is a schematic of a cross-point memory cell array in accordance with an embodiment.

It will be understood that the memory array is not limited to the array configuration illustrated in FIG. 2B and additional array configurations can also be used with memory cells including the memory element disclosed above.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:
1. A method of making a memory cell, comprising:
forming a via through an insulation layer;
forming a lower portion of an interlayer conductive element comprising:
   forming a first conductive liner adhering to a lower portion of sidewalls of the via; and
   forming a first conductive plug in the first conductive liner;
forming an upper portion of the interlayer conductive element comprising:
   forming a second conductive liner adhering to a top surface of the first conductive plug and an upper portion of the sidewalls of the via; and
   forming a second conductive plug located within the second conductive liner;

forming a variable resistance memory element comprising a metal oxide layer on an end of the upper portion of the interlayer conductive element opposite an end adjacent to the lower portion of the interlayer conductive element; and forming a top electrode layer contacting the metal oxide layer, wherein the second conductive liner includes sidewall portions having a thickness different than a thickness of sidewall portions of the first conductive liner, wherein the lower portion of the sidewalls of the via are aligned with the upper portion of the sidewalls of the via.

2. The method of claim 1, wherein the first conductive liner and the second conductive liner are formed of material with different material compositions.

3. The method of claim 1, wherein the thickness of the sidewall portions of the first conductive liner is greater than the thickness of the sidewall portions of the second conductive liner.

4. The method of claim 1, wherein the thickness of the sidewall portions of the first conductive liner is less than the thickness of the sidewall portions of the second conductive liner.

5. The method of claim 1, wherein the metal oxide layer is characterized by having a programmable resistance.

6. The method of claim 1, wherein the forming of the variable resistance memory element comprising the metal oxide layer includes oxidizing a portion of the second conductive plug.

7. The method of claim 1, wherein the first conductive plug and the second conductive plug have different material compositions.

8. The method of claim 1, wherein the first conductive plug and the second conductive plug have the same material composition.

9. The method of claim 1, wherein the first conductive liner and the first conductive plug have different material compositions.

* * * * *